(12) United States Patent
Zlotnik et al.

(10) Patent No.: US 11,747,843 B1
(45) Date of Patent: Sep. 5, 2023

(54) POWER SUPPLY VOLTAGE DROP COMPENSATION

(71) Applicant: Micron Technology, Inc., Boise, ID (US)

(72) Inventors: Leon Zlotnik, Camino, CA (US); Leonid Minz, Beer Sheva (IL); Ekram H. Bhuiyan, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/717,638

(22) Filed: Apr. 11, 2022

(51) Int. Cl.
  *G05F 1/46* (2006.01)
  *G06F 1/28* (2006.01)
  *G11C 5/14* (2006.01)

(52) U.S. Cl.
  CPC .............. *G05F 1/46* (2013.01); *G06F 1/28* (2013.01); *G11C 5/147* (2013.01)

(58) Field of Classification Search
  None
  See application file for complete search history.

(56) References Cited

U.S. PATENT DOCUMENTS

| | | | |
|---|---|---|---|
| 3,430,070 A | 2/1969 | Marshall, Jr. et al. | |
| 5,179,295 A | 1/1993 | Mattison et al. | |
| 5,767,717 A | 6/1998 | Schorn et al. | |
| 8,461,869 B1* | 6/2013 | Rahim | H03K 19/17784 326/47 |
| 9,599,672 B2 | 3/2017 | Abhishek et al. | |
| 9,698,694 B2* | 7/2017 | Xiang | H02M 3/33592 |
| 9,766,640 B2* | 9/2017 | Okajima | G06F 1/3296 |
| 10,531,032 B2* | 1/2020 | Cho | H04N 5/374 |
| 11,269,365 B2* | 3/2022 | Murakami | G05F 3/245 |
| 2006/0294282 A1 | 12/2006 | Warner | |
| 2007/0040577 A1* | 2/2007 | Lewis | G06F 30/398 326/41 |
| 2013/0076381 A1* | 3/2013 | Takayanagi | G01K 3/005 374/1 |

\* cited by examiner

*Primary Examiner* — Thomas J. Hiltunen
(74) *Attorney, Agent, or Firm* — Brooks, Cameron & Huebsch, PLLC (57) ABSTRACT

Aspects of the present disclosure are directed to voltage drop compensation for power supplies. One method includes sensing each voltage, via a voltage sensor, of a plurality of voltages from different areas of circuit components prior to the voltage reaching a voltage regulator, receiving, at a voltage manager, a sensed voltage magnitude from the voltage sensor for at least one of the plurality of voltages, receiving, at a voltage manager, data for a number of characteristics of the circuitry components, and selecting a correction voltage to be provided to the voltage regulator based on the sensed voltage magnitude from the voltage sensor for the at least one of the plurality of voltages and data for at least one of the characteristics of the circuitry components.

20 Claims, 6 Drawing Sheets

POWER SUPPLY VOLTAGE DROP COMPENSATION

TECHNICAL FIELD

Embodiments of the disclosure relate generally to power supplies, and more specifically, relate to voltage drop compensation for power supplies.

BACKGROUND

A memory system is a system on a chip and as such can have many different sub-systems thereon. Such sub-systems can include digital logic and an associated power supply, voltage control, and clock control, among other sub-systems. A memory sub-system can also be a storage system, storage device, a memory module, or a combination of such. An example of a memory sub-system is a storage system such as a solid-state drive (SSD). These sub-systems need a certain amount of power to perform their designated functions. Accordingly, a power supply is used to power these sub-systems. In some implementations, areas that have a high IR drop (i.e., high current draw) reduce the voltage (V at component=Vreg−IR). So, the Vreg is adjusted (increased) to compensate for the decreased voltage resulting from the increased current at the component. Accordingly, this creates a voltage drop due to the increased current that is undesirable.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to power supply voltage compensation. In various embodiments, as taught in the present disclosure, a power supply voltage compensation system can monitor multiple areas, for example, within a system on chip and compensate for IR (i.e., voltage) drop in areas needing assistance with an IR drop.

Such embodiments will be particularly beneficial in implementations where a circuitry area of a system on chip is under a constant load and the voltage regulator cannot compensate for these loads. For example, one circuit area may be close to the regulator and another may be far from the regulator. The far area may have much more resistance due to such things as length of the electrical connection lines, the passing through circuit components like the printed circuit board, internal power grid, or a substrate, and temperature that may be affecting the regulator feedback. Currently, the regulator feedback is provided from a single location. Such a measurement may not be accurate for areas with a resistance load due to physical differences between locations.

In the embodiments of the current disclosure, these current loads can be determined for each area having a deficiency. These values can be stored in memory and used, for example, to determine the amount of supplemental voltage that is to be provided to each particular area as will be discussed in more detail below. In some implementations, the values stored in memory can be analyzed by machine learning to determine trends in the values, and to further precision the amount of supplemental voltage to provide and the timing of the application of the supplemental voltage to each circuitry area needing supplemental voltage.

As described in more detail herein, aspects of the present disclosure allow for implementation of power supply voltage compensation in several circuitry areas by the voltage regulator. For example, a method of facilitating such voltage drop compensation for power supplies can be accomplished by sensing each voltage, via a voltage sensor, of a plurality of voltages from different areas of circuit components prior to the voltage reaching a voltage regulator, receiving, at a voltage manager, a sensed voltage magnitude from the voltage sensor for at least one of the plurality of voltages, receiving, at a voltage manager, data for a number of characteristics of the circuitry components, and selecting a correction voltage to be provided to the voltage regulator based on the sensed voltage magnitude from the voltage sensor for the at least one of the plurality of voltages and data for at least one of the characteristics of the circuitry components.

The different areas of circuitry components can, for example, be partitions or areas within a partition. Examples of partitions include various portions of a memory system such as core logic, which can include the processor and/or local memory. The partitions can also include the memory devices as well as interface circuitry between the memory devices and a controller and/or between the controller and the host (i.e., host interface circuitry).

Examples of sub-systems, such as storage devices and memory modules, are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area that can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states, while a TLC can store multiple bits of information and has eight logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates, while floating-gate architectures generally do not allow for the select gates to be programmed. During operation, a memory sub-system can receive various memory access requests (e.g., requests to read or "retrieve" data and/or requests to write or "program" data to a memory device of the memory sub-system).

Figure 1:
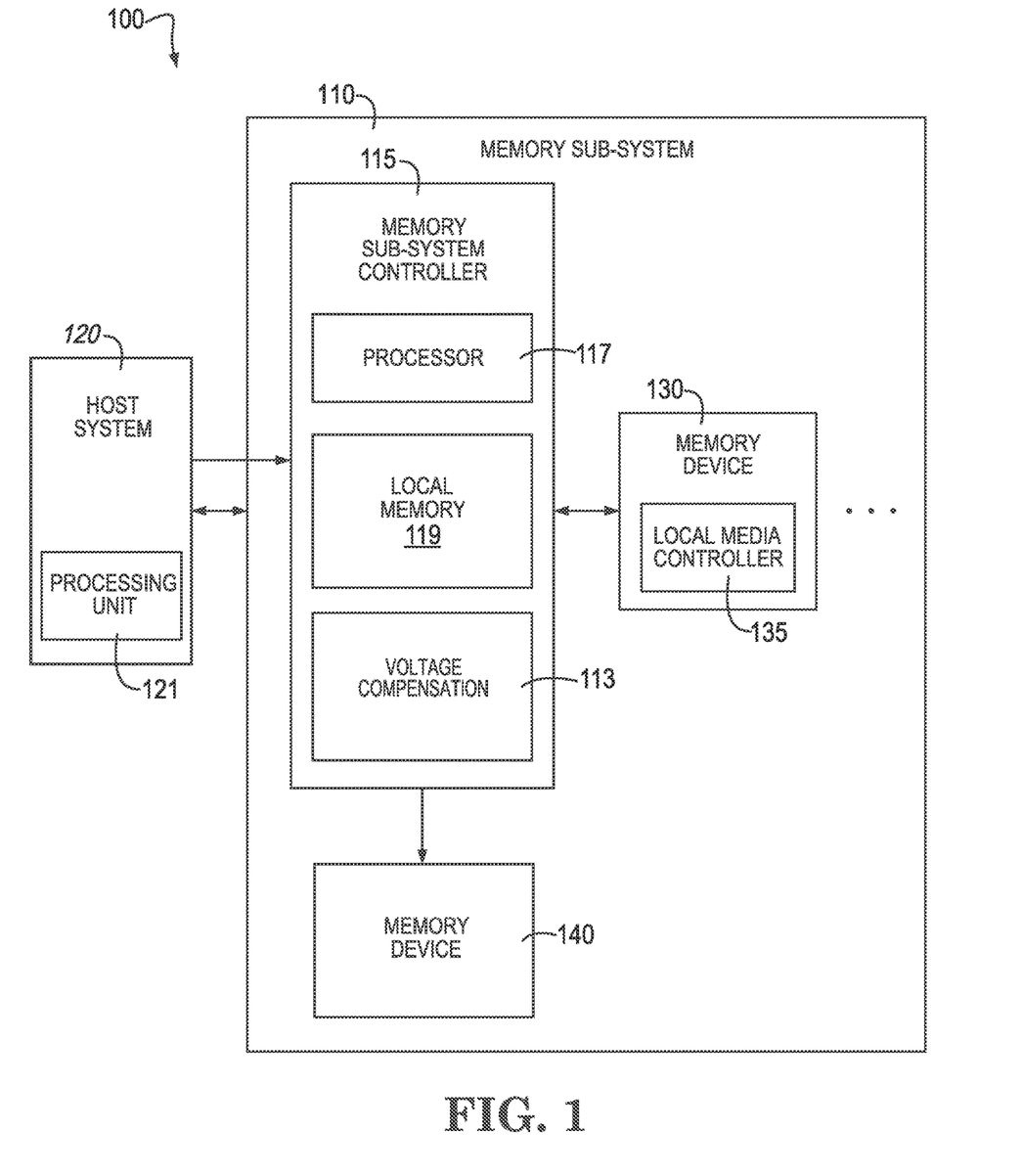
FIG. 1 illustrates an example computing system that includes a memory sub-system in accordance with some embodiments of the present disclosure.

FIG. 1 illustrates an example computing system that includes a memory sub-system in accordance with some embodiments of the present disclosure. The memory sub-system 110 of system 100 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing device 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a voltage compensation component 113. Although not shown in FIG. 1 so as to not obfuscate the drawings, the voltage compensation component 113 can include various circuitry to facilitate performance of operations to perform voltage compensation, for example, on various circuit portions of the controller 115, memory devices 130, 140, and/or interfaces thereof. The voltage compensation component 113 can include a regulator and other circuitry such as those described in FIGS. 3 and 4.

In some embodiments, the memory sub-system controller 115 includes at least a portion of the voltage compensation component 113. For example, the memory sub-system controller 115 can include a processor 117 (processing device) configured to execute instructions stored in local memory 119 for performing the operations described herein. In some embodiments, the voltage compensation component 113 is part of the host system 110, an application, or an operating system.

In some embodiments, the memory sub-system 110, and hence the voltage compensation component 113, can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

In a non-limiting example, an apparatus can include a host computing device (e.g., the host system 120) and a processing unit 121 resident on the host computing device. As used herein, the term "resident on" refers to something that is physically located on a particular component. For example, the processing unit 121 being "resident on" the host system 120 refers to a condition in which the hardware circuitry that comprises the processing unit 121 is physically located on the host system 120. The term "resident on" can be used interchangeably with other terms such as "deployed on" or "located on," herein.

Continuing with this example, the processing unit 121 can cause the data to be written to the group of memory cells. At some point after the data has been written to the group of memory cells of the memory device, the processing unit 121 can issue a request to the memory device (e.g., can issue a command to the voltage compensation component 113, the processor 117, and/or the local media controller 135) to read the data from the group of memory cells.

Figure 2:
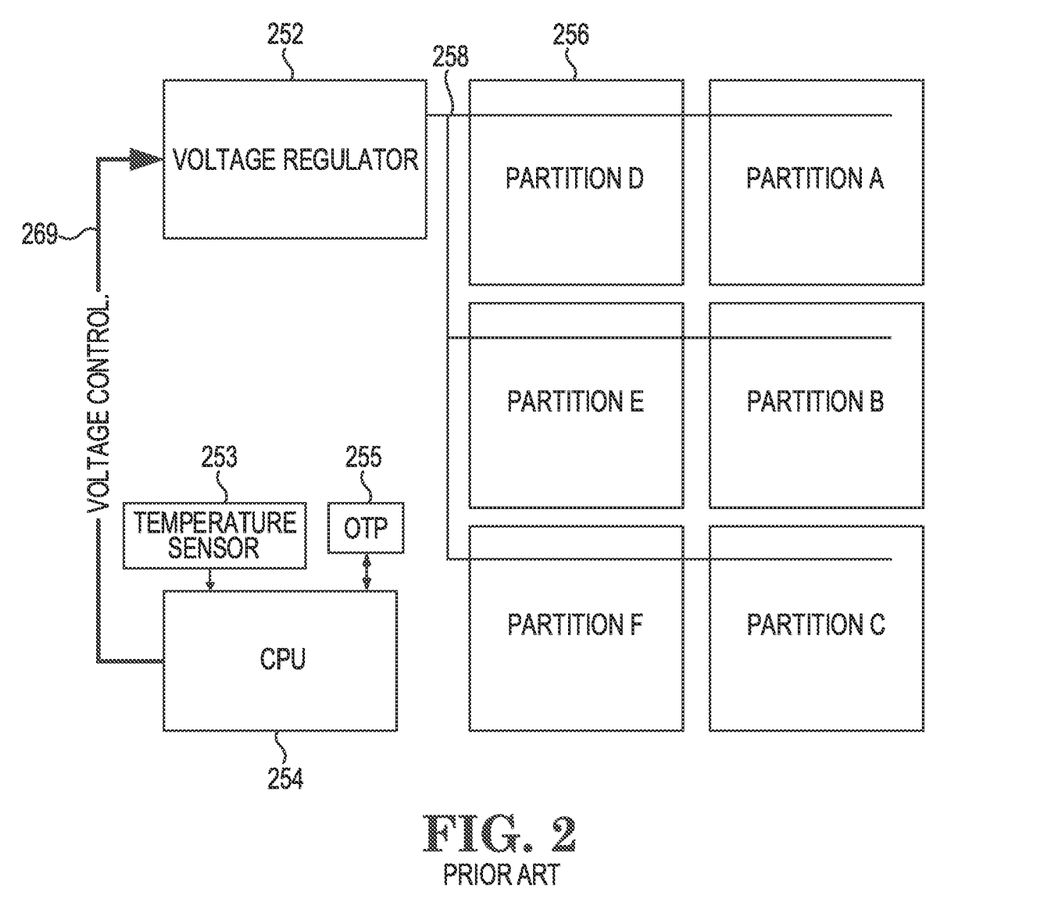
FIG. 2 illustrates a prior art power supply system.

FIG. 2 illustrates a prior art power supply system. In this prior art system, the voltage of a number of circuitry portion areas 256 is regulated by a voltage regulator 252 via output lines 258. A processor 254 determines an adjustment voltage and sends a voltage control signal 269 to the voltage regulator 252 to adjust the voltage for all circuitry portion areas 256 by the adjustment voltage. The processor 254 determines the adjustment voltage based on the sensed temperature from the temperature sensor 253. This is accomplished by comparing the sensed temperature to a list of temperatures with corresponding voltage adjustment values stored on a look-up table in memory (e.g., a one-time programmable component 255). Accordingly, for sensed temperature X, the processor 254 accesses the look-up table and finds temperature X. The processor 254 then refers to the voltage adjustment associated with temperature X and selects that voltage adjustment to be sent to the voltage regulator 252. This voltage adjustment is then used for all areas 256 of the circuit.

Because this adjustment voltage is to be applied to all areas, the adjustment voltage values are estimated based upon supposed peak loads for all areas. Such calculations can result in considerable inaccuracy in particular areas of the circuitry among other issues. For example, this single adjustment factor's use in all areas of the circuitry can result in excessive voltage in some areas of the circuitry at one or both of its static (when standing by) and dynamic (when performing tasks) voltage values, more aggressive power mesh, challenging hold time closure, EM issues, and other issues associated with the higher voltage and current.

Figure 3:
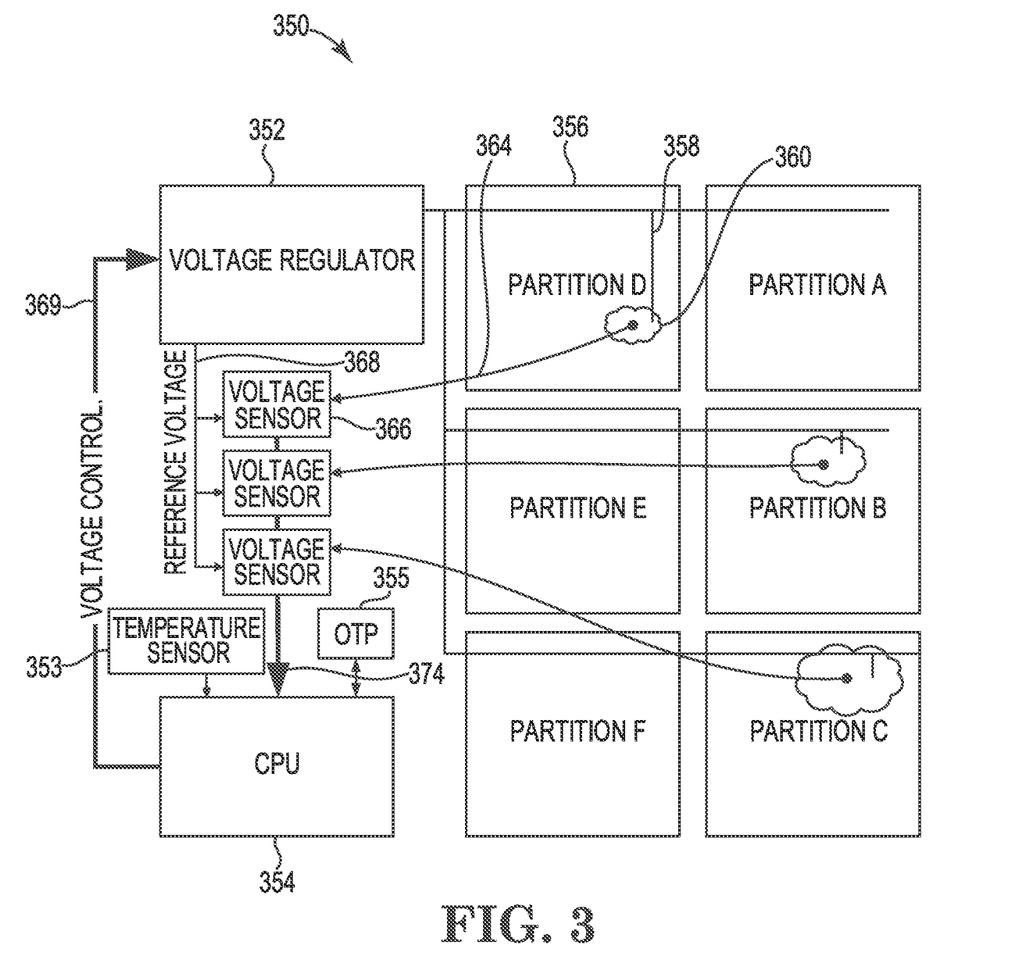
FIG. 3 illustrates a power supply voltage compensation system in accordance with some embodiments of the present disclosure.

FIG. 3 illustrates a power supply voltage compensation system in accordance with some embodiments of the present disclosure. In FIG. 3, the apparatus 350 includes a number of circuit portion areas 356 (e.g., partitions A-F) that have power supplied thereto via a voltage regulator 352 through output lines 358. As shown, these output lines can be connected to areas 360 that may be determined to have or may have the potential to have a power deficiency (current and/or voltage) during operation of the circuitry. The deficient or potentially deficient areas 360 can have supplemental voltage directed to them in the form of a voltage adjustment to keep their voltage level near or above a target voltage level. In order to know what supplemental voltage to provide, the areas 360 can be connected, directly or indirectly, to the reference voltage input 368 of the voltage regulator 352. This can be accomplished by connection lines 364 from areas 360.

The regulator circuitry 352 can also include various other regulator circuitry such as LDO regulators, buck regulators, boost regulators, buck-boost regulators, etc. Additionally, the embodiments of the present disclosure can be used in any circuit for which voltage adjustment over time may be warranted.

In the example illustrated in FIG. 3, a plurality of areas 360 are being monitored and connection lines are running from those areas to voltage sensors 366. The system then determines what supplemental voltage is needed and provides that power to bring the voltage level at the area in a particular partition to a threshold (target) level.

In such an embodiment, the system can include one or more sensors of a number of voltage sensors 366 that accesses lines 364 sequentially or randomly and provides the reading to the voltage manager 354. In this manner, the voltage can be sensed and that voltage data can be provided via line 374 to a voltage manager 354. The voltage manager can be a processor, such as processor 117 of FIG. 1, and the voltage compensation component 113 can be the other sensing and supplemental voltage related components shown in FIG. 3.

The voltage manager can provide several functions. For example, as discussed above, the voltage manager 354 can determine which circuitry area 360 should be addressed by a voltage adjustment by the voltage regulator 352. This can, for example, be accomplished by comparing the sensed voltages of each circuitry area 360 based on the sensed voltage data taken by sensor 366 and provided via line 374. The comparison can determine criteria for adjustment of the voltage such as: a threshold voltage level, an average voltage level over a time period, a lowermost voltage, or an uppermost voltage.

One example apparatus (e.g., 350) including such a voltage manager includes a voltage regulator (e.g., 352) configured to provide an output supply voltage to a plurality of circuit portions (e.g., on output lines 358), a plurality of voltage sensors (e.g., 366) configured to sense respective voltages at the plurality of circuit portions (e.g., 360), and a voltage manager (e.g., 354), configured to monitor the respective sensed voltages from the plurality of voltage sensors (e.g., 366) and determine, based on one or more particular criterion, a correction voltage to the voltage regulator, and wherein the voltage regulator is configured to adjust the output supply voltage based on the selected particular one of the plurality of sensed voltages.

In various embodiments, the one or more particular criterion is selected from the group including temperature data, activity status indication data, and process type indication data. For example, the temperature data can be provided by the temperature sensor. The criteria can be stored in memory, such as the one-time programmable component (e.g., 355). These non-temperature characteristics can be associated with voltage amounts that can be combined with the temperature voltage adjustment and the sensed-target based components of the updated voltage adjustment.

In some implementations, the voltage manager (e.g., 354) can further be configured to adjust the particular voltage by applying the voltage adjustment quantity to the particular voltage to bring the particular voltage toward the target voltage magnitude, such as a threshold voltage level stored in memory.

This embodiment includes a temperature sensor 353 and a memory component 355 that can be used to provide data for additional criteria to be considered when determining the adjustment voltage. As discussed above, a voltage manager functionality can be provided by processor 354. It can be utilized, for example, to determine an adjustment voltage and to send a voltage control signal 369 to the voltage regulator 352 to adjust the voltage for a particular one of the circuitry portion areas 356 by an updated adjustment voltage, as discussed herein. Unlike the system in FIG. 2, the system of FIG. 3 can have different adjustment voltage amounts for different circuitry areas 356. In such an embodiment, the processor 354 determines the adjustment voltage based on the sensed temperature from the temperature sensor 353.

Similarly, this process can again be accomplished by comparing the sensed temperature to a list of temperatures with corresponding voltage adjustment values stored on a look-up table in memory (e.g., one-time programmable component 355). Accordingly, for sensed temperature X, the processor 354 accesses the look-up table and finds temperature X.

However, in the present embodiment, the sensed voltage from the voltage sensor 366 is used as the base voltage from the area. Its sensed value is compared to a target voltage value and if there is a difference, an additional correction voltage of that difference is combined with the voltage adjustment to provide an updated voltage adjustment. The processor 354 then sends the updated voltage adjustment, via voltage control signal 369, to the voltage regulator 352. This voltage adjustment is then used for the area where the sensed voltage that was used in the calculation came from.

In some embodiments, the processor can send separate signals for the updated voltage adjustment those being a temperature component and a sensed voltage-target adjustment component. Likewise, the updated adjustment voltage can be distributed by the voltage regulator in a temperature component and a sensed voltage-target adjustment component.

Figure 4:
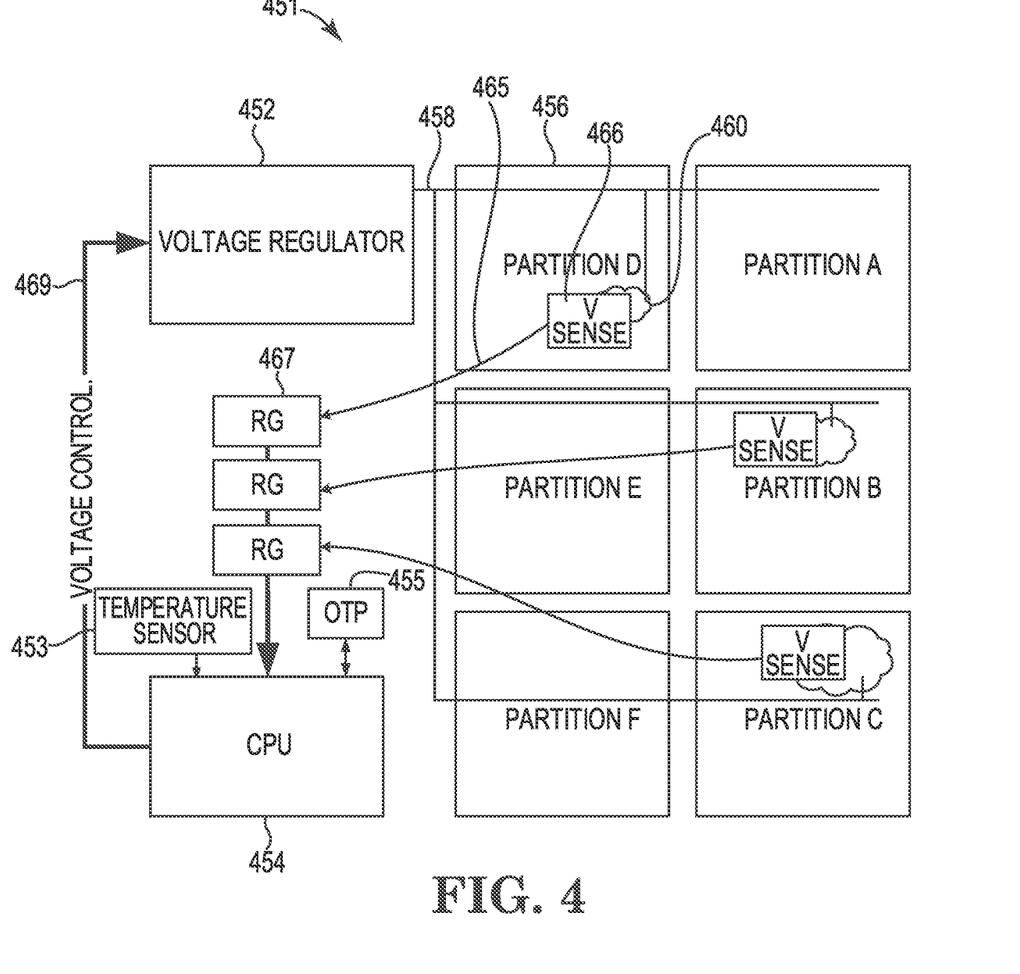
FIG. 4 illustrates another power supply voltage compensation system in accordance with some embodiments of the present disclosure.

FIG. 4 illustrates another power supply voltage compensation system in accordance with some embodiments of the present disclosure. In this system 451, the system also includes a voltage regulator 452 regulating voltages in a number of circuitry areas 460 within circuitry components 456 via output lines 458.

The voltages of areas 460 are sensed by voltage sensors 466, but in this embodiment, the voltage sensors are located close to the areas that will receive the supplemental voltages. In some embodiments, these voltage sensors can be provided within the circuitry area to be sensed.

The sensed voltage values are then communicated via lines 465 to registers 467 which then relays those values to the processor 454. In this way, the sensed voltage is obtained near the areas 460 and therefore is more accurate than the arrangement shown in FIG. 3.

This embodiment also includes a temperature sensor 453 and a memory component 455 that can be used to provide data for additional criteria to be considered when determining the adjustment voltage. For example, a processor 454 determines an adjustment voltage and sends a voltage control signal 469 to the voltage regulator 452 to adjust the voltage for a particular one of the circuitry portion areas 456 by the adjustment voltage.

Again, unlike the system in FIG. 2, the system of FIG. 4 can have different adjustment voltage amounts for different circuitry areas 456. In such an embodiment, the processor 454 determines the adjustment voltage based on the sensed temperature from the temperature sensor 453, but adds a correction voltage if there is a difference between a sensed voltage and a target voltage.

Determining the adjustment voltage based on the temperature is again accomplished by comparing the sensed temperature to a list of temperatures with corresponding voltage adjustment values stored on a look-up table in memory (e.g., one-time programmable component 455). Accordingly, for sensed temperature X, the processor 454 accesses the look-up table and finds temperature X.

However, here the sensed voltage from the voltage sensor 466 is used as the base voltage from the area. Its sensed value is compared to a target voltage value and if there is a difference, an additional correction voltage is combined with the voltage adjustment to provide an updated voltage adjustment. The processor 454 then sends the updated voltage adjustment, via voltage control signal 469, to the voltage regulator 452. This voltage adjustment is then used for the area where the sensed voltage that was used in the calculation came from.

Figure 5:
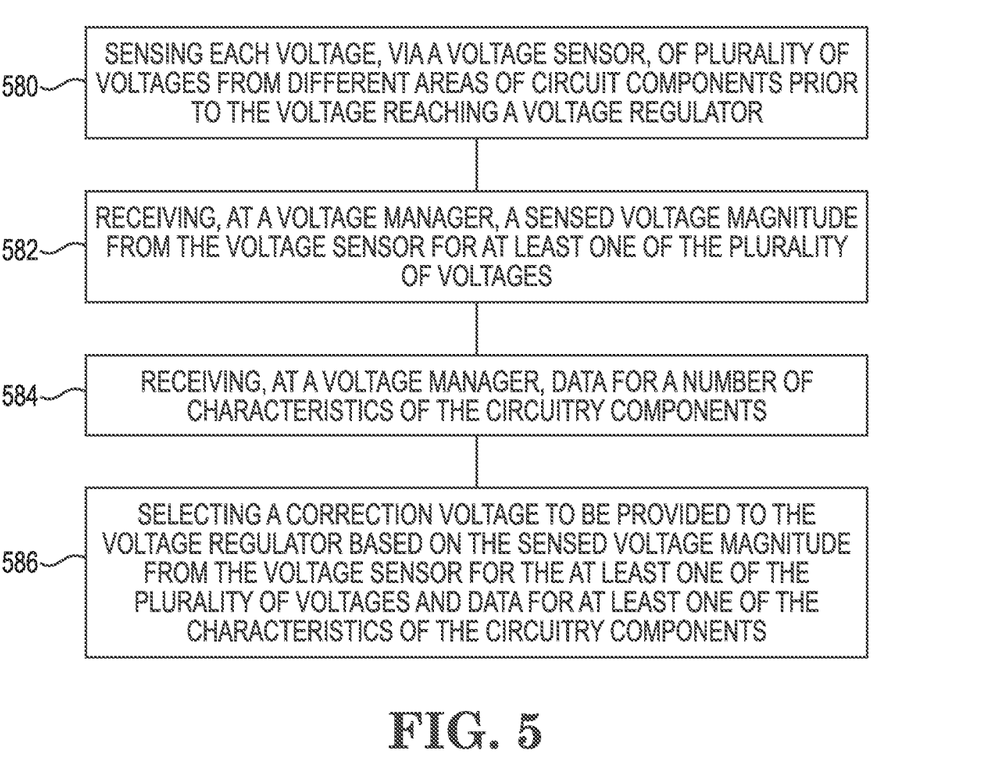
FIG. 5 is a flow diagram corresponding to a method for providing power supply voltage compensation in accordance with some embodiments of the present disclosure.

FIG. 5 is a flow diagram corresponding to a method for providing power supply voltage compensation in accordance with some embodiments of the present disclosure. At block 580, the method includes sensing each voltage, via a voltage sensor, of plurality of voltages from different areas of circuit components prior to the voltage reaching a voltage regulator. As discussed herein, the voltage can be received via an electric connection line connected to one of the different areas.

At block 582, the method includes receiving, at a voltage manager, a sensed voltage magnitude from the voltage sensor for at least one of the plurality of voltages. Further, at block 584, the method includes receiving, at a voltage manager, data for a number of characteristics of the circuitry components. Additionally, this method includes selecting a correction voltage to be provided to the voltage regulator based on the sensed voltage magnitude from the voltage sensor for the at least one of the plurality of voltages and data for at least one of the characteristics of the circuitry components, at block 586.

As discussed, in some embodiments, the adjustment may be preselected and, in other embodiments, the voltage regulator will determine the voltage adjustment based on the feedback input received. The method can also include adjusting the voltage at a first area, via the voltage regulator, by applying the voltage adjustment quantity to the voltage to bring the voltage toward the target voltage magnitude.

In some embodiments, the voltage sensor is electrically connected to a wire from the circuitry area to the regulator. Such a connection may also be accomplished by other electric connection line structures, such as circuitry integrated into the system on chip architecture.

In various embodiments, the data for the number of characteristics of the circuitry components includes at least one of temperature data, activity status indication data, and process type indication data. This data can be stored in memory or determined in real time, for example, through a temperature sensor.

The correction voltage can saved in memory as a correction value, for example, in a one time programmable component. The correction value can then be accessed and sent to the voltage regulator at a subsequent time.

Figure 6:
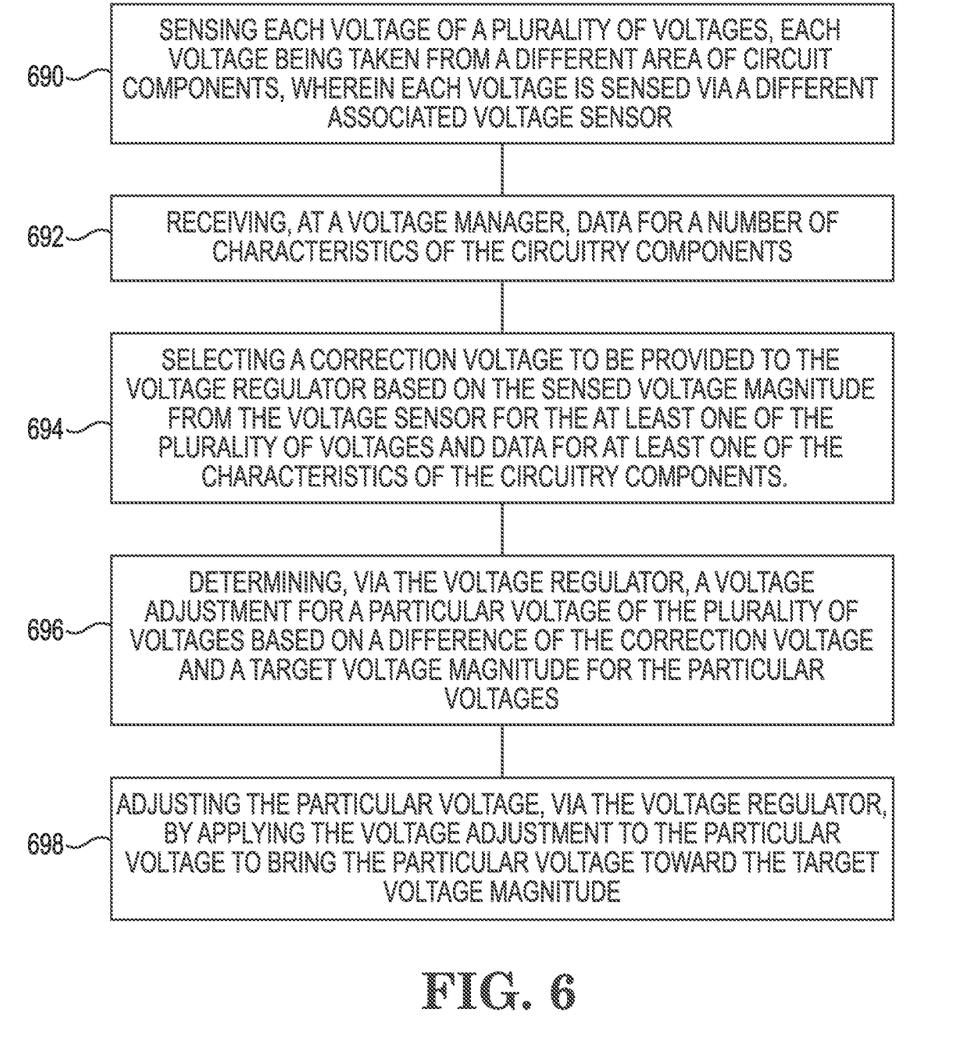
FIG. 6 is another flow diagram corresponding to a method for providing power supply voltage compensation in accordance with some embodiments of the present disclosure.

FIG. 6 is another flow diagram corresponding to a method for providing power supply voltage compensation in accordance with some embodiments of the present disclosure. The method includes sensing each voltage of a plurality of voltages, each voltage being taken from a different area of circuit components (e.g., different partitions or areas of a partition of a system on chip), wherein each voltage is sensed via a different associated voltage sensor, at block 690. At block 692, the method includes receiving, at a voltage manager, data for a number of characteristics of the circuitry components.

The method further includes, at block 694, selecting a correction voltage to be provided to the voltage regulator based on the sensed voltage magnitude from the voltage sensor for the at least one of the plurality of voltages and data for at least one of the characteristics of the circuitry components. At block 696, the method includes determining, via the voltage regulator, a voltage adjustment for a particular voltage of the plurality of voltages based on a difference of the correction voltage and a target voltage magnitude for the particular voltage. The method also includes adjusting the particular voltage, via the voltage regulator, by applying the voltage adjustment to the particular voltage to bring the particular voltage toward the target voltage magnitude, at block 698.

In some embodiments, each different area of the system on chip power supply is within a different partition. In other embodiments, each different area of the system on chip power supply is within a particular partition.

The sensed voltage magnitude can be a digital sensed reading or an analog sensed reading. The embodiments can further include comparing the sensed voltage magnitudes for each voltage to determine a lowest voltage magnitude. This information can then be utilized for selecting the particular voltage based on the lowest voltage magnitude. As the selected lowest voltage is increased to its target voltage, the voltage manager can continue to compare sensed voltages and if a voltage that is sensed is now lower than the selected area, the manager can switch to the area with the lower voltage once the current area being addressed has reached its target voltage.

A similar technique can be used with sensed highest voltages. Such a technique may be beneficial, for example, to limit a system on chip's power or control associated performance.

Embodiments of the present disclosure can be beneficial for implementations where the IR drop is static, as described above. The embodiments of the present disclosure can also be beneficial in providing fast or automatic IR drop compensation for systems exhibiting random or periodic high power consumption behavior through switching to the area exhibiting the lowest voltage magnitude thereby addressing the area with the most need quickly.

The embodiments of the present disclosure remove high voltage supply margins that most system on chip implementations, especially large systems, introduce to make up for IR drop. Such embodiments save power and improve performance which are important benefits in many situations.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
sensing each voltage, via a voltage sensor, of a plurality of voltages sensed from different areas of circuit components within memory partitions of a memory system;
receiving, at a voltage manager, a sensed voltage magnitude from the voltage sensor for at least two of the plurality of voltages;
determining a first particular area of circuit components to provide supplemental voltage to based on a comparison of the sensed voltage magnitudes;
receiving, at a voltage manager, data for a number of characteristics of the circuitry components;
selecting, by the voltage manager, a correction voltage that is then provided to a voltage regulator, the correction voltage being selected based on the sensed voltage magnitude from the voltage sensor for the at least one of the plurality of voltages and data for at least one of the characteristics of the circuitry components; and
as the selected first particular area voltage is increased to a target voltage, via the correction voltage, the voltage manager continues to compare sensed voltage magnitudes from different areas of circuitry components and if a different second particular area voltage that is sensed is now lower than the selected first particular area, the voltage manager can switch to the different second particular area with the lower voltage once the current first particular area being addressed has reached its target voltage.

2. The method of claim 1, wherein the data for the number of characteristics of the circuitry components includes at least one of temperature data, activity status indication data, or process type indication data.

3. The method of claim 1, wherein the voltage sensor is connected to a wire from one of the different areas of the circuitry components to the voltage regulator.

4. The method of claim 1, wherein the correction voltage is saved in memory as a correction value.

5. The method of claim 4, wherein the correction value can be accessed and sent to the voltage regulator at a subsequent time.

6. The method of claim 4, wherein the memory is a one time programmable component.

7. The method of claim 1, wherein a conductive line is fetched between one of the different areas of the circuitry components and the voltage regulator.

8. A method comprising:
sensing each voltage of a plurality of voltages, each sensed voltage being taken from a different area of circuit components within memory partitions of a memory system, wherein each voltage is sensed via one or more associated voltage sensors;
receiving, at a voltage manager, a sensed voltage magnitude for each voltage from at least two of its associated voltage sensors;
determining a first particular area of circuit components to provide supplemental voltage to based on a comparison of the sensed voltage magnitudes;
receiving, at a voltage manager, data for a number of characteristics of the circuitry components;
selecting, by the voltage manager, a correction voltage that is then provided to a voltage regulator, the correction voltage being selected based on the sensed voltage magnitude from the voltage sensor for the at least one of the plurality of voltages and data for at least one of the characteristics of the circuitry components;
determining, via the voltage regulator, a voltage adjustment for a particular voltage of the plurality of voltages based on a difference of the correction voltage and a target voltage magnitude for the particular voltage;
adjusting the particular voltage, via the voltage regulator, by applying the voltage adjustment to the particular voltage to bring the particular voltage toward the target voltage magnitude; and
as the selected first particular area voltage is increased to a target voltage, via the correction voltage, the voltage manager continues to compare sensed voltage magnitudes from different areas of circuitry components and if a different second particular area voltage that is sensed is now lower than the selected first particular area, the voltage manager can switch to the different second particular area with the lower voltage once the current first particular area being addressed has reached its target voltage.

9. The method of claim 8, wherein each different area is within a different partition.

10. The method of claim 8, wherein each different area is within a particular partition.

11. The method of claim 8, wherein the sensed voltage magnitude is a digital sensed reading.

12. The method of claim 8, wherein the sensed voltage magnitude is an analog sensed reading.

13. The method of claim 8, wherein the data for the number of characteristics of the circuitry components includes at least one of temperature data, activity status indication data, or process type indication data.

14. An apparatus, comprising:
a voltage regulator configured to provide an output supply voltage to a plurality of circuit portions;
a plurality of voltage sensors each configured to sense a respective voltage at one of the plurality of circuit portions; and
a voltage manager, configured to:
monitor the respective sensed voltages from the plurality of voltage sensors; and
determine, based on one or more particular criterion, a correction voltage to the voltage regulator, and wherein the voltage regulator is configured to adjust the output supply voltage based on the determined correction voltage; and
determining a first particular area of circuit components to provide supplemental voltage to based on a comparison of the sensed voltage magnitudes; and
as the selected first particular area voltage is increased to a target voltage, via the correction voltage, the voltage manager continues to compare sensed voltage magnitudes from different areas of circuitry components and if a different second particular area voltage that is sensed is now lower than the selected first particular area, the voltage manager can switch to the different second particular area with the lower voltage once the current first particular area being addressed has reached its target voltage.

15. The apparatus of claim 14, wherein the one or more particular criterion are selected from the group including temperature data, activity status indication data, and process type indication data.

16. The apparatus of claim 15, wherein the temperature data is provided by a temperature sensor.

17. The apparatus of claim 15, wherein the data for the particular criterion is stored in memory.

18. The apparatus of claim 15, wherein the data for the particular criterion is stored in one time programmable memory.

19. The apparatus of claim 14, wherein the particular criterion is a threshold voltage level.

20. The apparatus of claim 14, wherein the voltage manager communicates the correction voltage to the voltage regulator via a voltage control signal.

\* \* \* \* \*